United States Patent [19]

Alfaro et al.

[11] Patent Number: 5,201,454
[45] Date of Patent: Apr. 13, 1993

[54] PROCESS FOR ENHANCED INTERMETALLIC GROWTH IN IC INTERCONNECTIONS

[75] Inventors: Rafael C. Alfaro, The Colony, Tex.; Lau B. Howe, Subanq Java, Malaysia; Thomas H. Ramsey, Garland, Tex.

[73] Assignee: Texas Instruments Incorporated, Dallas, Tex.

[21] Appl. No.: 768,501

[22] Filed: Sep. 30, 1991

[51] Int. Cl.$^5$ .......................................... H01L 21/607
[52] U.S. Cl. ..................................... 228/110; 228/4.5; 228/179
[58] Field of Search .................. 228/4.5, 1.1, 110, 179, 228/102

[56] References Cited

U.S. PATENT DOCUMENTS

| | | | |
|---|---|---|---|
| 3,054,309 | 9/1962 | Elmore et al. | 228/1.1 |
| 3,641,660 | 2/1972 | Adams et al. | 228/3 |
| 3,747,198 | 7/1973 | Benson et al. | 228/111 |
| 3,776,447 | 12/1973 | Adams et al. | 228/3 |
| 3,908,886 | 9/1975 | Raske | 228/110 X |
| 4,836,883 | 6/1989 | Hatcher, Jr. | 156/657 X |
| 4,842,662 | 6/1989 | Jacobi | 228/110 X |
| 4,854,494 | 8/1989 | von Raben | 228/110 |
| 4,889,274 | 12/1989 | Ramsey | 228/179 |

OTHER PUBLICATIONS

"Very high energy ultrasonics" E. A. Neppiras, Special Article *British Journal of Applied Physics* vol. 11, Apr. 1960, pp. 143–150.
"Ultrasonics: An Aid to Metal Forming?", Langenecker et al., *Metal Progress*, vol. 85, Apr. 1964, pp. 97–101.
"Effects of Ultrasound on Deformation Characteristics of Metals," Langenecker, *IEEE Transactions on Sonics and Ultrasonics*, vol. SU-13, No. 1, Mar. 1966, pp. 1–8.
"A Note on the Effect of Ultrasonic Activation on Diffusion and Sintering", Hochman et al., *International Journal of Powder Metallurgy*, vol. 2, 1966, pp. 15–16.
"The Influence of Ultrasonic Energy on Kinetic Processes in Solids", Hayes et al., *IEEE Journal on Sonics and Ultrasonics*, vol. SU-16, No. 2, Apr. 1969, pp. 68–75.
"Intermetallic Formation in Gold-Aluminum Systems" E. Philofsky, *Solid State Electronics*, vol 13, 1970, pp. 1391–1399.
"High-Frequency Fatigue in Aluminum", Chevaller et al. *J. Appl. Phys.*, vol. 43, No. 1, Jan. 1972, pp. 73–77.
"The Formation of Ultrasonic Bonds Between Metals", K. Joshi, *Welding Journal*, vol. 50, Dec. 1971, pp. 840–848.
"Metallurigical Failure Modes of Wire Bonds", G. Harman, 12th Annual Proceedings, Reliability Physics Symposium, Apr. 1974, pp. 131–141.
"Sonochemistry", K. Suslick, *Science*, vol. 247, Mar. 1990, pp. 1439–1445.
"Phenomenological Considerations in Ultrasonic Welding", Jones et al., *Welding Research Supplement*, Jul. 1961, pp. 289–305.

*Primary Examiner*—Kenneth J. Ramsey
*Attorney, Agent, or Firm*—W. James Brady, III; B. Peter Barndt; Richard L. Donaldson

[57] ABSTRACT

An apparatus (10) and method is provided for bonding wire (12) to the bond sites (28) of integrated circuits (14). In preferred embodiments a bond end (30) on gold wire (12) is bonded to aluminum bond pad (28). Apparatus (10) includes a high frequency ultrasonic energy source (20) designed to provide ultrasonic energy at frequencies from about 100 kHz to about 125 kHz. The ultrasonic energy is imparted to the bonding interface (32) via transducer (18) and capillary (16). The transducer (18) is modified in length and tool clamp point (40) is sited on transducer (18) so that the high frequency ultrasonic energy is at the antinodal point in its application to interface (32) and thus is optimized. In preferred embodiments of the process, the ultrasonic energy is applied at about 114 kHz. In this fashion, the bond formed between bond end (30) and bond pad (28) is optimized in terms of shear strength, bonding time and processing temperatures.

Particularly beneficial results are noticed with respect to aluminum alloy bond pads such as Al, 2% Cu, which have been particularly troublesome in terms of intermetallic formation and bond strength in the prior art. Thus according to the invention, the use of high frequency ultrasonic energy in the aforementioned range, results in superior strength bonds formed with greater processing parameter flexibility.

15 Claims, 6 Drawing Sheets

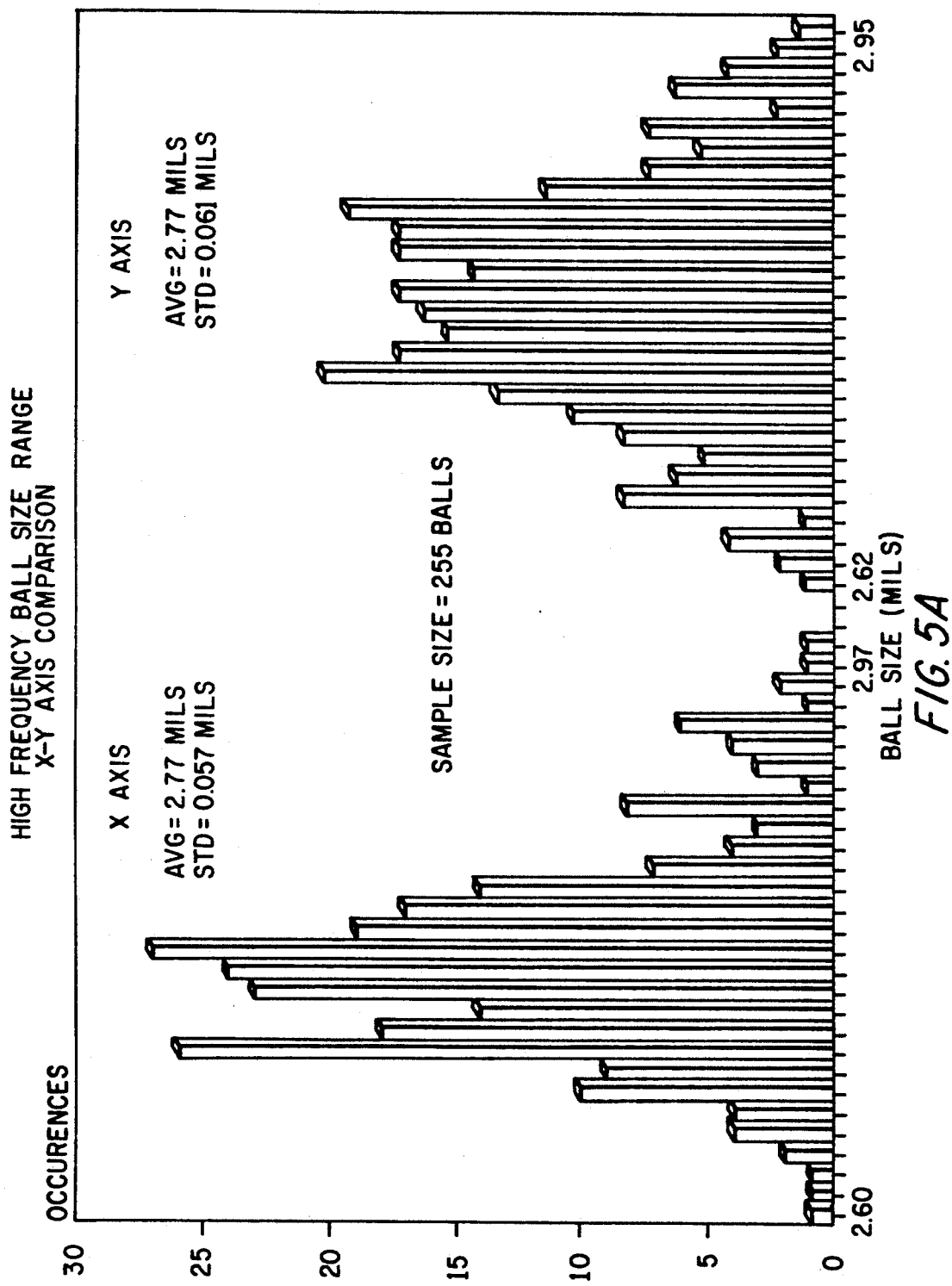

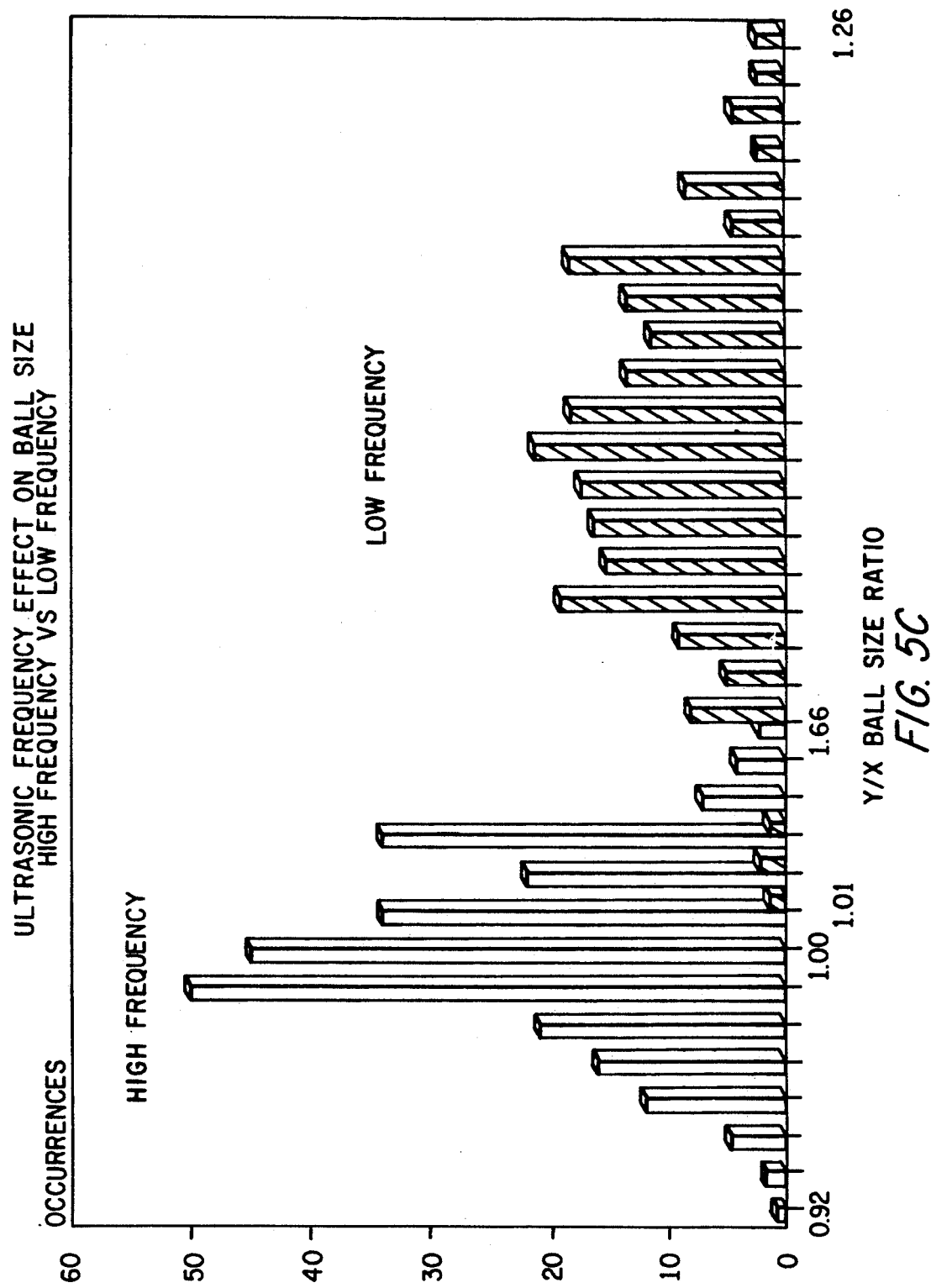

PROCESS FOR ENHANCED INTERMETALLIC GROWTH IN IC INTERCONNECTIONS

CROSS-REFERENCE TO RELATED APPLICATIONS

The following coassigned patent applications are hereby incorporated herein by reference:

TI-14427, filing date Sep. 30, 1991; Ser. No. 07/767,741

TI-15645, filing date Sep. 30, 1991; Ser. No. 07/767,731

TI-15067, filing date Sep. 30, 1991; Ser. No. 07/767,740

BACKGROUND OF THE INVENTION

1. Field of the Invention

This invention relates to integrated circuit (IC) interconnections. More particularly, it relates to IC interconnections utilizing high frequency ultrasonic energy.

2. Description of the Prior Art

The standard technique for making circuit interconnections for plastic encapsulated semiconductor devices utilizes the bonding of metals, for example, gold wire to aluminum or aluminum alloy surfaces (e.g. bond pads). The bond or weld formed eventually results in an intermetallic structure of several possible phases, depending on time and temperature and dictated by diffusion behavior. The highest bond strength will be obtained by initiating the maximum intermetallic coverage.

Contaminated surfaces, undesirably low temperatures and nonoptimum bonding parameters all contribute to less than adequate reaction of the gold and aluminum surfaces. The maximum bond strength and highest quality bond is obtained through optimum phase growth. Hence, a bonding process is needed to optimize the reactivity of the bonding materials, e.g. gold and aluminum. Additionally, it would be advantageous to achieve a process wherein lower temperatures and shorter bonding times could be achieved for greater processing flexibility.

In addition, a particular problem exists with aluminum alloys (e.g. Al, 2% Cu; or Al, 1% Si, 0.5% Cu). With aluminum alloys even greater reactivity retardation is experienced, thus ultimately damaging the bond strengths involving aluminum alloys.

What is needed is a process which facilitates optimum reactivity of metals such as gold and aluminum in the bonding process for greater (perhaps even 100%) coverage of the cross-sectional area of the bond. Also needed is a process which allows for greater parameter flexibility, such as lower temperatures and/or shorter bonding times and/or lower pressures.

SUMMARY OF THE INVENTION

The problems outlined above are in large measure solved by the method and apparatus in accordance with the present invention. That is to say the invention hereof provides a bonding process yielding greater cross-sectional coverage, resulting in greater bond strength. Furthermore, the invention provides a flexible process wherein parameters such as temperature, time and pressure can advantageously be adjusted without detrimental effect. Hence, the invention provides stronger bonds with greater process flexibility in the making of those bonds. The invention provides these benefits utilizing high frequency ultrasonic energy with appropriately modified hardware (e.g. the transducer and piezoelectric crystals).

In addition, by utilizing high frequency ultrasonic energy in a range from about 100 to about 125 kHz, the present invention solves the above mentioned coverage problem heretofore associated with aluminum alloys bonded to gold.

In preferred embodiments, the invention provides a transducer and piezoelectric crystals mounted thereon, energized with ac current at about 114 kHz. A capillary is mounted on the transducer and feeds gold wire onto an aluminum bond pad with the interface between the ball (on the gold wire) and the bond pad being at about 175° C. in accordance with the invention.

Generally speaking, the invention provides a method of forming a microelectronic bond, the method comprising the steps of:

(a) providing a conductive bond site;

(b) providing a wire having a ball;

(c) contacting the bond end of the wire to the bond site, the bond end and the bond site presenting an interface therebetween; and (d) applying ultrasonic energy at the interface in a range from about 100 kHz to about 125 kHz.

BRIEF DESCRIPTION OF THE DRAWINGS

FIGS. 5A-5C compare concentricity for ball bonds formed respectively at 60 kHz and 114 kHz;

DESCRIPTION OF THE PREFERRED EMBODIMENT

The thermosonic bond process is a widely used method in the semiconductor industry. Generally, this process uses low frequencies that oscillate the transducer at around 60 kHz. The present invention deals with frequencies from about 100 to about 125 kHz, and it is at these frequencies that parameter such as ultrasonic power, bond time, mash force (pressure) and temperature are flexibly and advantageously modified.

Figure 1:
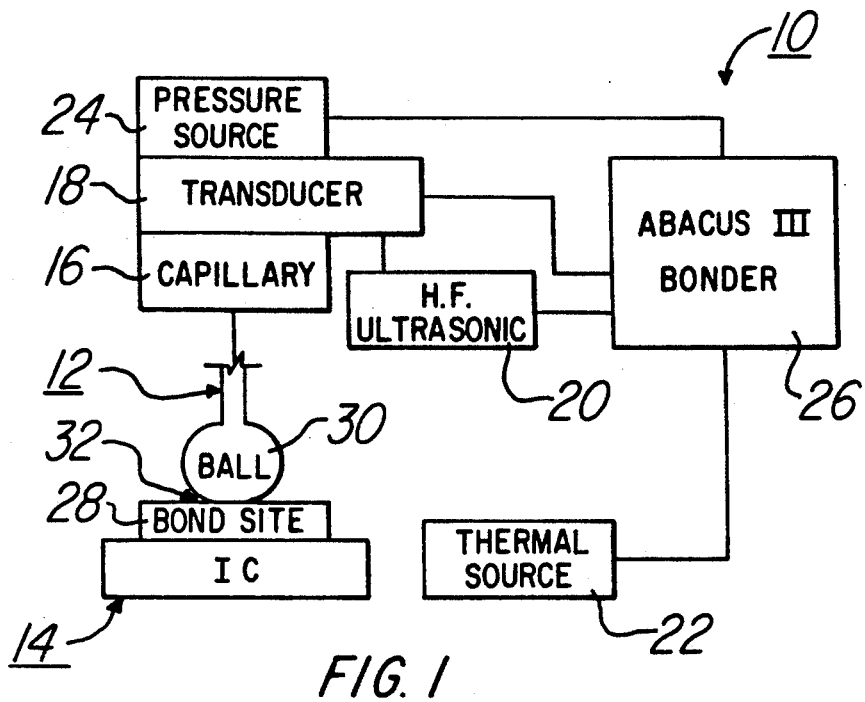
FIG. 1 is partially a block diagram, partially a schematic representation of a bonding apparatus used for bonding wire to a microelectronic integrated circuit in accordance with the present invention.

Referring now to the drawings in general and FIG. 1 in particular, a bonding apparatus 10 is depicted in block diagram with a wire 12 and a microelectronic integrated circuit 14. Bonding apparatus 10, according to the invention, utilizes high frequency ultrasonic (H.F. US) energy to create microelectronic interconnection bonds. The frequency range for the ultrasonic energy is from about 100 to about 125 kHz. Apparatus 10 includes a capillary 16, a modified transducer 18, an H.F. US energy source 20, a thermal source 22, a pressure source 24, and the remainder of apparatus 10 is represented by the box at reference numeral 26.

IC 14 is conventional in nature and could be, for example, a 16 megabit DRAM (dynamic random access memory) such as manufactured by Texas Instruments, Incorporated of Dallas, Tex. IC 14 substantially includes manufacturing grade monocrystalline silicon for the substrate but other materials could also be used. For example, but not by way of limitation, gallium arsenide or germanium could be used for the substrate of IC 14. Other types of memory ICs are within the scope of the present invention, such as static random access memories. Indeed, logic dies or linear semiconductors such as power devices could also be the subject of the present process. Additionally IC 14 need not be a VLSI chip but could also be an MSI or SSI chip, and indeed could be a discrete or hybridized component.

IC 14 includes a bond site 28. In preferred embodiments bond site 28 is a bond pad substantially made of aluminum alloy (2% copper). Other aluminum alloys such as 1% silicon, 0.5% copper could be utilized and indeed other metals or alloys could be used for bond site 28, either separately or in conjunction with aluminum.

Figure 3A:
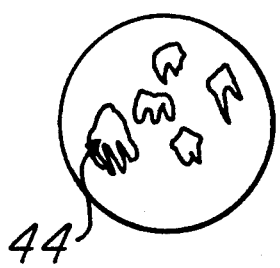
FIGS. 3A-3C are sectional views depicting various stages of intermetallic formation at interfaces where bonding occurs.
Figure 3B:
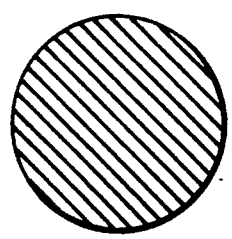
Figure 3C:
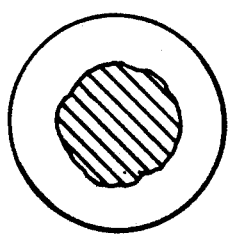

Wire 12 is pure gold in the preferred embodiment and includes ball 30. Alternatively, wire 12 could be made of a gold alloy, or wires made of other metals or alloys could also be used. Note the interface as indicated by reference numeral 32 is in a location analogous to the cross-sectional areas as depicted in FIGS. 3A-3C.

Capillary 16 acts as a conduit for wire 12 and imparts pressure and ultrasonic energy at the interface 32 during the bonding process, as is well known in the art. Capillary 16 is conventional in nature and is made of a synthetic resin material in the preferred embodiment.

Figure 2:
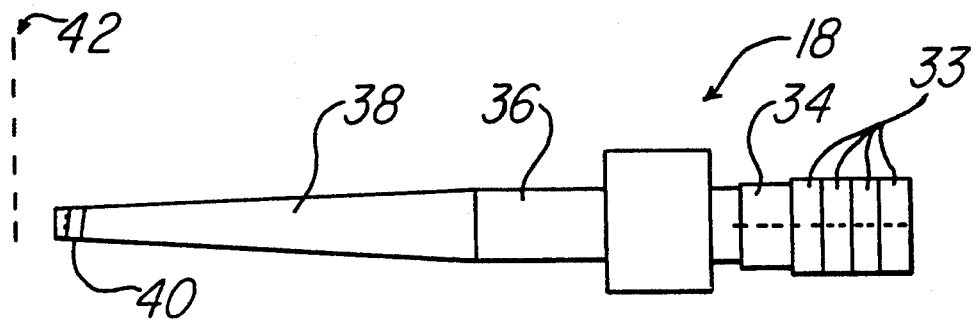
FIG. 2 is sectional elevational view of a transducer used in the bonding apparatus.

Referring to FIG. 2, metallic transducer (or horn) 18 is about ten centimeters in length and includes four piezoelectric crystals 33 on tail end 34. Horn 18 also includes a body portion 36 and a tapered front end 38 having a tool clamp point 40 where capillary 16 is mounted. Horn 18 is modified in length, and the number of piezoelectric crystals 33 and positioning of tool clamp point 40 are modified as compared to prior horns. The dashed line and reference numeral 42 indicates about where the tool clamp point is typically positioned in the somewhat longer transducer for the prior processing frequency of about 62.5 kHz. Note transducer 18 is shortened so that tool clamp point 40 is at the optimum position for imparting high frequency ultrasonic energy.

Figure 6:
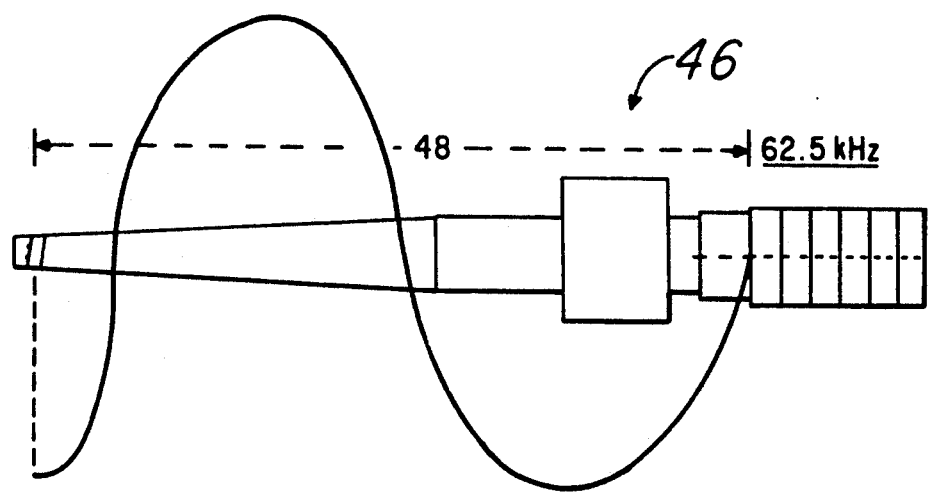
FIG. 6 illustrates the wavelength of low frequency ultrasonic energy superimposed on a prior art transducer designed therefor.
Figure 7:
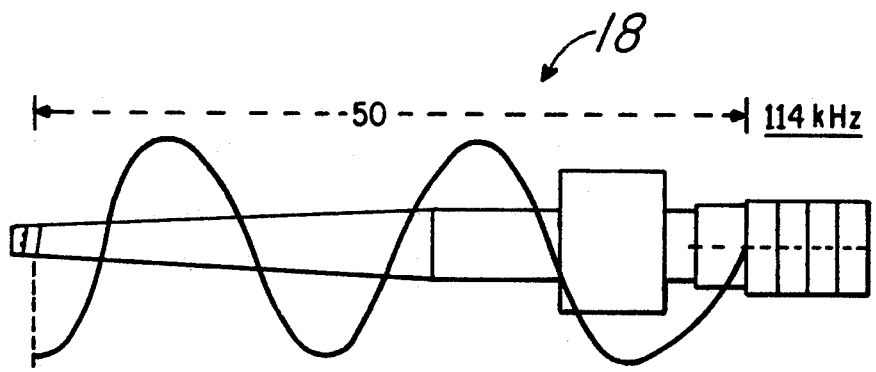
FIG. 7 illustrates the wavelength of high frequency ultrasonic energy superimposed on a transducer designed therefor in accordance with the present invention.

Referring to FIGS. 6 and 7, a prior art transducer 46 is depicted for comparison with transducer 18 of the present invention, as shown in FIG. 7. The prior art transducer 46 is effectively about 3.15 inches long, as indicated by reference numeral 48, and is designed to transmit US energy at about 62.5 kHz so that 1.25 wavelengths are disposed along the effective length 48 of transducer 46.

The effective length 50 of transducer 18 is about 2.98 inches. Transducer 18, as shown in FIG. 7, is designed to transmit H.F. US energy so that 2.25 wavelengths are disposed along effective length 50.

Thus, it will be noticed that the effective length 50 is reduced about fifty two mils compared to effective length 48. The specific reduction in length will depend on the H.F. US used and the design of the transducer, and these parameters will vary for different applications.

Referring again to FIG. 1, H.F. US source 20 is designed to provide an ac signal to piezoelectric crystals 33 in a range from about 100 to about 125 kHz. The frequencies discussed are those applied to the piezoelectric crystals. Thus the ultrasonic frequency at the interface may be slightly different, as is well known in the art. Ultrasonic source 20 is conventionally connected to the crystals.

Thermal source 22 is conventional in nature and provides thermal energy at the interface 32 to facilitate the bonding process. Pressure source 24 is conventional in nature and provides pressure (mashing) to interface 32 via capillary 16.

The remainder of apparatus 10, symbolized by the box at reference numeral 26 includes control circuitry, mechanical armature, etc. In the preferred embodiment, bonding apparatus 10 is the Abacus III bonder incorporating some or all of the improvements of the present invention. For a further discussion of H.F. US energy bonding utilizing a thermally heated transducer and axially aligned capillary and transducer with a substantially linear bond stroke in the Z direction, it is suggested to refer to the cross-referenced patent applications incorporated by reference. Each technique may have possible advantages in a specific technical application, in the context of the present invention. The Abacus III bonder is manufactured by Texas Instruments of Dallas, Tex. Other structural components and elements are not discussed in detail because of less direct relevance, but those skilled in the art will readily appreciate that such components and elements can be incorporated in apparatus 10.

The process of the present invention will now be discussed. Generally speaking, an IC 14 having a bond site 28 is appropriately secured on a chuck, lead frame, or the like (not shown) and then wire 12 is heated for formation of ball or bond end 30 as is well known in the art. Bond end 30 is then contacted to bond site 28 so as to present an interface 32 where welding or bonding occurs.

When thermosonic bonding is utilized, as is the case in the preferred embodiment, a thermal source 22 is used to apply to heat to interface 32 while capillary 16 positions and secures bond end 30 at bond site 28 while transducer 18 provides ultrasonic energy, and pressure source 24 applies mashing force via capillary 16. All of the above bonding steps are typically controlled by control circuitry in block 26, as is well known in the art.

For purposes of the present application, H.F. US means frequencies at about 100 kHz or above. Conversely, low frequency ultrasonic energy means ultrasonic energy at a frequency below about 100 kHz in the context of the present invention.

Referring now to FIGS. 3A-3C, various stages of intermetallic formation associated with microelectronic bonding or welding are illustrated. FIG. 3A shows somewhat limited intermetallic formation as illustrated by the spotty areas depicted at reference numeral 44. In the prior art, such partial coverage is common. This is the kind of intermetallic or bond formation that would be seen in a thermal range of about 175°–300° C. in the prior art, with US energy around 60 kHz. Normal plastic encapsulation processing (e.g. 5 hours at 175° C.) will convert the interface of pure aluminum bonded to gold to 100% intermetallic coverage as illustrated at FIG. 3B. However, 5 hours at 175° C. with doped metallizations, particularly Al, 2% Cu, obtains only about 50% area coverage as shown at FIG. 3C.

In contradistinction, when the ultrasonic energy at a range from about 100 to 125 kHz is used in accordance with the present invention at a temperature range between about 175° and 300° C., full coverage (i.e. about 100%) is obtained as in FIG. 3B. Other alloys experiencing the intermetallic retardation illustrated by FIG. 3A include: 1) Al, Cu 0-4%; 2) silicon doped aluminum; 3) palladium doped aluminum, or combinations of the same. These commonly used alloys create a phase or bond intermetallic formation retardation effect (i.e. the phases grow very slowly) and hence minimize the actual welded area of the bond. Sometimes the bond does not grow at all beyond some definite percentage of the area. It is therefore useful to increase the welded area, strength and reliability of the bond by utilizing the H.F. US energy.

The apparent increase in intermetallic growth and area coverage is directly dependent on the higher frequency ultrasonic energy of the present invention. The lower frequency (60 kHz) does not form a high level of welded bond structure with alloys as stated above, but with the higher frequency, a degree of chemical reactivity is obtained that results in 100% welded area or complete intermetallic area coverage and depth penetration. It effectively negates the phase growth retardation mechanism.

In addition, high frequency horn 18 (i.e. 100-125 kHz) - when coupled with specific bonding parameters, such as pressure, allows for almost 100% bond area coverage at lower temperatures such as 175° C.. The H.F. US energy will give substantially 100% area coverage at higher temperatures such as 300° C.. Thus, much more reliable bonds made of alloyed metallization required for certain types of circuit connections can be made with the H.F. US energy when coupled with the proper set of parameters.

The introduction of H.F. US energy provides other benefits to the gold ball bonding process. These benefits can be classified as mechanical and metallurgical. Mechanical benefits are those that effect ball shape predominately in the Y axis and stitch width—narrow in the Y axis and wide in the X axis, as well as ball necking which is observed during wire-pull testing. Metallurgical benefits are those affecting intermetallic reactivity which defines the integrity and reliability of the bond. It has been investigated and documented that any reduction in temperature effects the amount of intermetallic formed during bonding due to normal chemical reactivity. Any reduction of intermetallic translates to a relatively low shear-strength bond when tested. The reduction in temperature also requires a wider range of parameters in the bond process in order to deal with the multiplicity of aluminum alloys used in today's ICs, Al-Cu being the most difficult of the group.

The H.F. US energy can also afford a more positive, reliable and robust bond process at temperatures near or above 250° C.

The initial development of H.F. bonding created certain advantages over normal 60-70 kHz frequency. For example, temperature can be lowered with similar or enhanced intermetallic reactivity compared to the prior art. This phenomenon is observed with gold and aluminum. High quality welds with improved phase growth and intermetallic area coverage result, with higher strength bonds. Indeed, silver spot, gold wire bonds are achievable as low as 150° C.

Figure 5B:
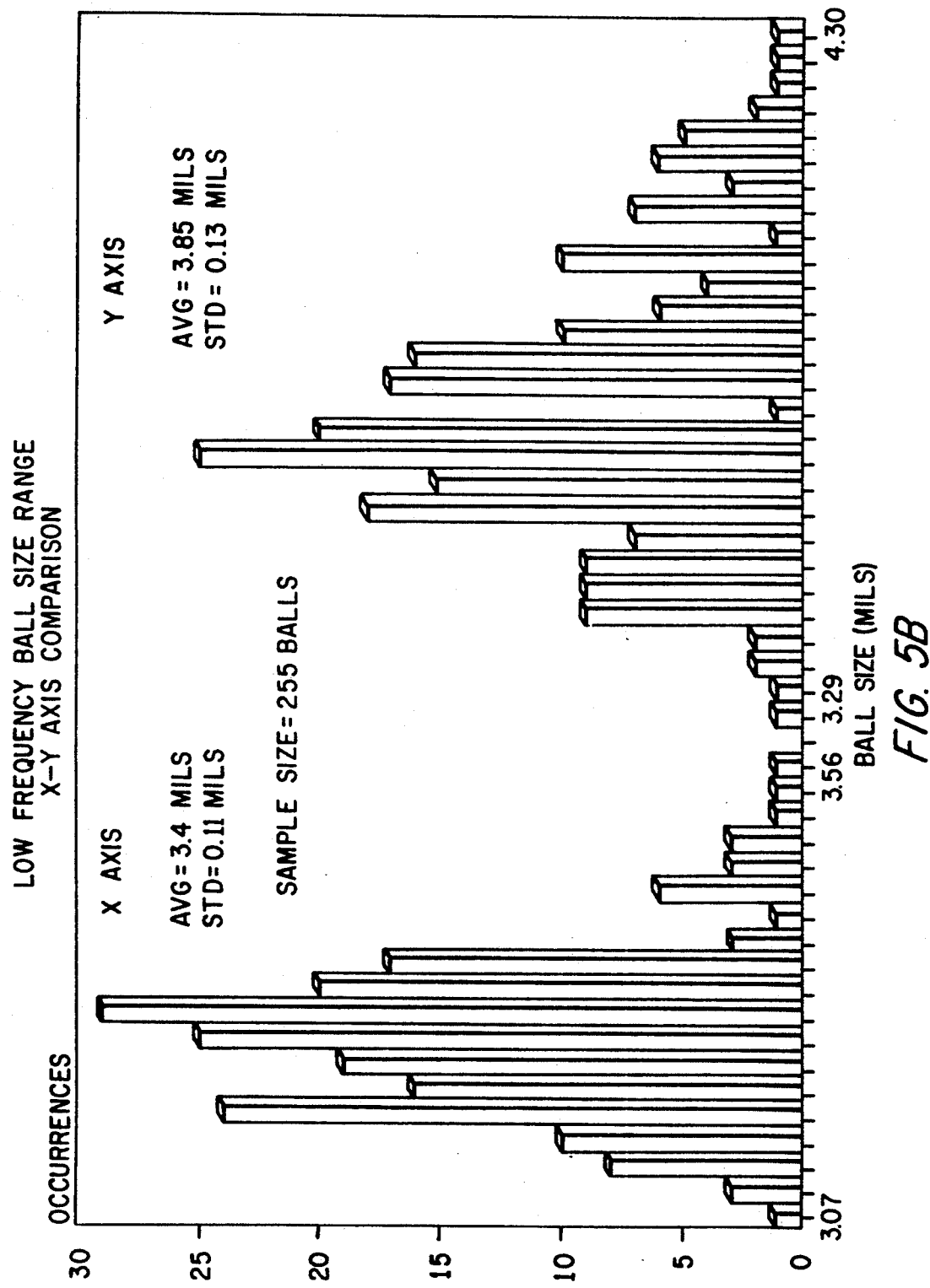

Use of higher frequencies indicates two other features. First, less out-of-round deformation of the ball results. After initial indication of this behavior was observed detailed experiments were made and statistical data obtained that showed effective reduction in bonded ball size and size uniformity, see FIG. 5A and FIG. 5C. FIG. 5B presents an example of ball size range generated by low frequency bonding (60-70 kHz). FIG. 5C compares ball size ratio between the high frequency and the low frequency bonding.

The distribution for the X-Y diameter range in FIG. 5A shows an almost round ball formed with H.F. US. As shown in FIGS. 5B and 5C the balls formed with conventional frequencies are much more eccentric as well as variable in size; this is particularly noticeable in FIG. 5C.

The second feature is related to one particular metal system, Al,1% Si. The nature of H.F. effects indicate that lower amplitude excursions may lead to lower potential for mechanical fracture initiation. Due to the fact that less mechanical working of the Au ball and Al,1% Si pad is observed with H.F. US energy, the potential for less Si particle penetration could result.

Bond Parameters

As indicated before, conventional frequencies (60 to 70 kHz) require a customized set of bond parameters for the various metal systems used in today's ICs.

Typically, pure Al pad metallizations require less US energy, less bond time, lower mash force and, in some cases, lower temperature. This is not true when bonding Al, 2% Cu which requires higher ultrasonic energy, longer bonding times, higher mash force and usually higher temperatures. This behavior is due to differences in reactivity of the alloy metal along with hardness and morphology.

The H.F. US bonding on the contrary offers a liberal range of parameters, making the bond process less restrictive and more robust. Table 1 (Tables 1-5 are located at the end of the Detailed Description.) shows a comparison between pure Al and Al, 2% Cu parameters as used in the high frequency bonding process.

Low temperature (below 200° C.) H.F. bonding opens a new field into the thermosonic bond process that changes the pattern established by conventional low frequency thermosonic bond processing. By definition, four parameters control the thermosonic bond process: ultrasonic power, mash force, temperature and time.

A) ULTRASONIC POWER

Ultrasonic power (in miliwatts) is generally in the range of 80 mW to 250 mW for most low frequency transducers (60 to 100 kHz). However, high frequency low temperature transducers will require a higher power output to achieve optimum bonds. One of the reasons for this increase is the reduction in the number of crystals (PZTs) forming the transducer motor. This reduction is necessary to achieve the frequency range selected.

The typical range for a high frequency low temperature transducer is 150 mw to 300 mW.

where $$P = (0.08176 \times PUPS \text{ value}/Zt)^2 \cdot Zh$$

and $$P = PUPS \text{ power}$$

-continued 0.08176 = Constant for maximum range (0.99)

$$Zt = Zs + Zh$$

$$Zs = Xc + R$$

$$Xc = \frac{1}{2pi \cdot f \cdot c}$$

$$R = 2.0 \text{ Ohms}$$

$$Zs(114 \text{ Khz}) = 2.5 \text{ Ohms}$$

$$Zh = \text{Horn Impedance}$$

The range established for the H.F. transducer 18 at low temperatures deals with most metal systems used in the bond pads of semiconductors. Tests performed using the mentioned range include Pure Al; Al, 2% Cu; Al, 1% Si, 0.5% Cu; and Pd as bond pad metallizations (see Tables).

Another important factor controlling US power output is the impedance of transducer 18, which is a critical factor when working with H.F. US transducers. H.F. US transducers are preferably operated at 18 Ohms +/−5 Ohms impedance when installed in a bondhead assembly.

B) MASH FORCE

The mash force, also denominated as clamping force, provides the conditions for proper energy transfer to the interface of the materials being bonded together. This energy will be in the form of heat (thermosonic process), ultrasonic vibration and pressure.

It is a well known phenomenon that when the mash force is exceeded, the ultrasonic vibration is damped to where it can no longer perform its function. In order to determine and optimize this parameter, experiments must be carefully designed and monitored.

High frequency bonding is more susceptible to mash force than low frequency bonding. Therefore, special attention should be given to this parameter. It is also important to mention that different metallization systems will require different mash force values.

C) TEMPERATURE

Temperature has been the dominant factor that determines the degree of alloying taking place during bonding. It is well documented that when temperatures fall below 250° C. with low frequency US, the formation of intermetallic compounds is drastically reduced, and if temperature drops below 200° C., intermetallics nearly stop forming. Only a mechanical interlocking of molecules keeping the bond structure together then occurs.

The advantage of H.F. US bonding resides in its ability to form intermetallic compounds within a broader range of temperatures, and the high degree of reaction seen with some metal systems; especially Al, 2% Cu (historically one of the most difficult metal systems to work with).

The low temperature H.F. (114 kHZ preferred) process can allow full intermetallic formation of Au-Al compounds at temperatures near 100° C. This process allows manufacturing of heat sensitive devices with better yields.

The use of high temperatures (>200° C.) with high frequencies provides a faster intermetallic reaction. This property can be used to optimize existing processes and to improve productivity without sacrificing quality.

D) TIME

Figure 4:
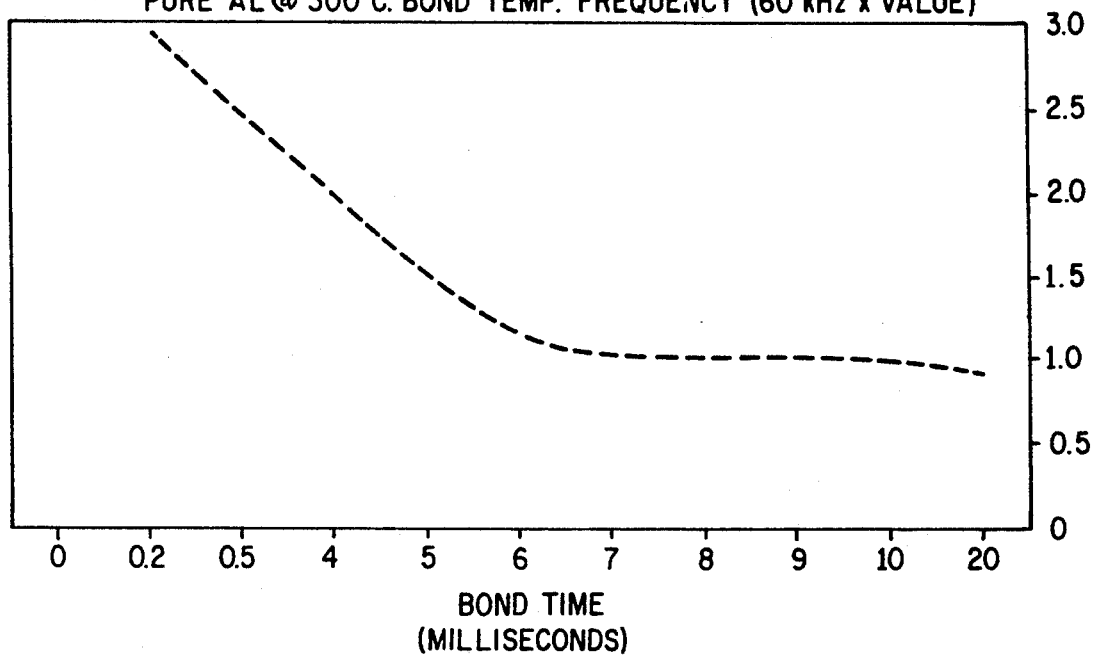
FIG. 4 graphically represents the relationship between ultrasonic frequency and bond time at 300° C. for bonding gold wire to pure aluminum.

This parameter controls how long the bonding energy is applied and it is normally expressed in milliseconds. FIG. 4 qualitatively illustrates the relationship between US frequency and bonding time. For low temperature H.F. bonding, the range of time does not differ from the one used for higher temperature low frequency processes. But when high temperature and high frequency are used together, then the range changes toward shorter times, allowing in some cases the possibility of bonding below 1.0 milliseconds and still achieving full intermetallic formation. Optimum bonds have been formed at 300° C. with only 0.5 milliseconds bond time.

ANALYSIS SUMMARY

The data collected from different experiments are summarized in Tables 1–5. These data include bond parameters, shear force and intermetallic reaction and coverage.

The bond parameters are expressed using generic terminology (grams, volts, milliseconds). The bonding modes (I-Mode, Servo Mode) available in the Abacus III bonder do make a significant impact in the quality of bond; because of this, a separate column will be added to the table of results.

The data from Tables 1–3 represent a summary of 175° C. bonding experiments; experiments were also carried out at 300° C. bonding temperature for the same materials. The results from these experiments do not differ from the conventional low frequency high temperature bonding. The major change occurs with time and intermetallic reaction. When the time factor is reduced by at least 25% or more, the formation of intermetallics is faster and yet complete.

If H.F. is to be applied to conventional processes (high temperature), Table 4 could provide a starting point for an optimized set of parameters.

BONDING MODE ANALYSIS

The two bonding modes available in the Abacus III deserve special attention due to their impact on H.F. low temperature bonding.

I-Mode and Servo Mode show differences when compared; Table 5 summarizes the data from these evaluations.

CONCLUSIONS REGARDING TABLES 1–5

It is concluded that faster bond cycles can be obtained at 300° C. bond temperature with equal or even better quality, implying that H.F. low temperature bonding is possible without any sacrifice in existing production rates.

From the experiments conducted using alternate bonding modes (I, Servo), it is possible to say that the structural integrity of the bond is not affected by either mode but it does affect the morphology of the bonded ball. From the two modes available, I-Mode gives more optimum results.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

TABLE 1

Ball Bond Parameters
175° C. Bond Temperature

| | Mash Force (grams) Range | PUPS Setting TP-6 (Vp-p) Range | Time (MSEC) Range | Early Fire TP-6 (Vp-p) Range |
|---|---|---|---|---|
| Pure Al | 35-45 | 11.0-13.0 | 6-8 | 3.0-4.0 |
| Al 2% Cu | 70-100 | 14.0-15.0 | 8-10 | 4.0-6.5 |
| ***Al 1% Si 0.5% Cu | 60-80 | 14.0-16.0 | 10-14 | 2.0-4.0 |
| Pd cap Hermetic | 60-100 | 22.0-26.0 | 8-10 | 5.0-7.0 |

***EPIC II metal system.

TABLE 2

Post Bond Shear Data
175 C. Bond Temperature

| | Average | Std. Dev. | Minimum | Maximum |
|---|---|---|---|---|
| Pure Al | 75.4 g | 6.5 g | 63.5 g | 87.4 g |
| Al 2% Cu | 73.3 g | 4.5 g | 61.7 g | 81.3 g |
| **Al 1% Si 0.5% Cu | 73.1 g | 8.5 g | 46.5 g | 85.4 g |
| Pd cap Hermetic | 58.7 g | 9.5 g | 37.3 g | 79.2 g~ |

*Pd being a hard material requires temperatures around 300 C. for optimum bonding.
**Material used presented bond pad delamination

TABLE 3

Post Bond Intermetallic Reaction
175 C. Bond Temperature

| | Visual % Reaction | Ball Diameter |
|---|---|---|
| Pure Al | 100 | 3.0 mils |
| AL 2% Cu | 95 | 3.2 mils |
| Al 1% Si 0.5~u | 100 | 3.2 mils |

Pd cab Hermetic Au wire bonded to Pd forms a solid solution no intermetallic is formed.

TABLE 4

Ball Bond Parameters
300° C. Bond Temperature

| Mash Force | PUPS Power TP-6 (Vp-p) | PUPS Time | Early Fire TP-6 (Vp-p) |
|---|---|---|---|
| 40-70 g | 8.0-11.0 | 4-8 MSEC. | 2.0-4.0 |

Important Note: Zh = 19 Ohms was used during these experiments.

TABLE 5

175° C. Bond Temperature
114 KHZ Transducer

| | I-MODE | | SERVO MODE | |
|---|---|---|---|---|
| | Pure AL | Al 2% Cu | Pure Al | Al 2% Cu |
| Shear Force | | | | |
| Mean | 75.4 G | 73.3 g | 43.8 g | 78.5 g |
| Std Dev | 6.5 g | 4.5 g | 4.1 g | 15.4 g |
| Min | 63.5 g | 61.7 g | 32.0 g | 44.8 g |
| Max | 87.4 g | 81.3 g | 51.0 g | 97.6 g |
| Bond Diameter | 3.0 mils | 3.2 mils | 2.4 mils | 3.4 mils |
| Bonded Area Intermetallic | 7.1 mils | 8.0 mils | 4.5 mils | 8.7 mils |
| visual inspect | 100% | 100% | 100% | 95% |
| Shear Strength (g/mil 2) | 10.6 | 9.1 | 9.7 | 9.0 |

We claim:

1. A method of forming an intermetallic bond structure, the method comprising the steps of:
   providing a conductive metal bond site;
   providing a conductive metal wire having a bond end;
   contacting the bond end of the wire to the bond site such that the bond end and the bond site present an interface therebetween;
   providing ultrasonic energy having a frequency of at least approximatley 100 kHZ; and
   effecting intermetallic phase growth over substantially the entire interface, including the step of applying the ultrasonic energy at the interface, wherein the ultrasonic energy is applied throughout a desired bonding time period, and wherein the intermetallic phase growth is completed during the bonding time period.

2. The method of claim 1 wherein the ultrasonic energy is applied at about 114 kHz.

3. The method of claim 1 further comprising the step of:
   applying heat to the interface whereby the interface experiences a temperature less than 200° C.

4. The method of claim 3 wherein the interface experiences a temperature of about 175° C.

5. The method of claim 1 further comprising the step of:
   applying heat to the interface whereby the interface experiences a temperature of 200° C. or greater.

6. The method of claim 5 wherein the interface experiences a temperature of about 300° C.

7. A method of forming a microelectronic bond, the method comprising the steps of:
   providing a conductive bond site;
   providing a wire having a bond end;
   contacting the bond end of the wire to the bond site, the bond end and the bond site presenting an interface therebetween;
   applying ultrasonic energy at the interface in a frequency range from about 100 kHz to about 125 kHz; and
   applying heat to the interface whereby the interface experiences a temperature of about 300° C.

8. A method of forming a microelectronic bond, the method comprising the steps of:
   providing a conductive bond site;
   providing a wire having a bond end;
   contacting the bond end of the wire to the bond site, the bond end and the bond site presenting an interface therebetween; and
   applying ultrasonic energy at the interface in a frequency range from about 100 kHz to about 125 kHz for less than 1 millisecond.

9. A method of forming a microelectronic bond, the method comprising the steps of:
   providing a conductive bond site;
   providing a wire having a bond end;
   contacting the bond end of the wire to the bond site, the bond end and the bond site presenting an interface therebetween; and
   applying ultrasonic energy at the interface in a frequency range from about 100 kHz to about 125 kHz for about 0.5 milliseconds.

10. The method of claim 1 wherein mash force is applied at the interface in a range from about 40 grams to about 70 grams.

11. The method of claim 1 wherein the wire substantially includes gold.

12. The method of claim 11 wherein the bond site includes substantially pure aluminum.

13. The method of claim 11 wherein the bond site includes an aluminum alloy having about 1% silicon and 0.5% copper.

14. The method of claim 11 wherein the bond site includes an aluminum alloy having about 2% copper.

15. The method of claim 11 wherein the bond site includes palladium.

* * * * *